(12) United States Patent
Vonreyn

(10) Patent No.: US 6,591,388 B1
(45) Date of Patent: Jul. 8, 2003

(54) HIGH SPEED SINK/SOURCE REGISTER TO REDUCE LEVEL SENSITIVE SCAN DESIGN TEST TIME

(75) Inventor: Timothy J. Vonreyn, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/551,130

(22) Filed: Apr. 18, 2000

(51) Int. Cl.[7] ............................................... G01R 31/28
(52) U.S. Cl. ......................................... 714/726; 326/16
(58) Field of Search ................................ 714/726–729, 714/43–44, 739, 820, 814, 731, 733; 326/16, 202, 39; 708/250; 324/158.1, 765, 537, 73.1

(56) References Cited

U.S. PATENT DOCUMENTS

| | | | |
|---|---|---|---|
| 4,503,537 A | | 3/1985 | McAnney |
| 5,491,666 A | | 2/1996 | Sturges |
| 5,574,853 A | | 11/1996 | Barch et al. |
| 5,612,963 A | * | 3/1997 | Koenemann et al. ....... 714/739 |
| 5,640,404 A | | 6/1997 | Satish |
| 5,828,579 A | | 10/1998 | Beausang |
| 5,872,793 A | | 2/1999 | Attaway et al. |
| 6,055,658 A | * | 4/2000 | Jaber et al. ................. 714/726 |

OTHER PUBLICATIONS

Colwell et al. 'A 0.6 &MU;M BICMOS Processor With Dynamic Execution; IEEE International Solid–State Circuits Conference; pp.: 176–177, 361, 15–17 Feb. 1995'.*

NA9109230: 'Latched I/O AC Test Using a Reduced Pin Boundary Scan Logic Test Method; IBM Tech. Disc Bulletin,, vol. 34 Issue: 4A, pp.: 230–232, Sep. 1, 1991'.*

T.E. Dillinger et al.; Mechanism for Scan–Basec Test Application at High–Speed; IBM Technical Disclousure Bulletin, vol. 39, No. 9, Sep., 1996.

O. Bula et al.; New Approach to Level Sensitive Scan Design Testing; IBM Technical Disclosure Bulletin, vol. 30, No. 7, Dec. 1987.

A.D. Savkar; N–Way Testpoint for Complex LSI Design; IBM Technical Disclosure Bulletin, vol. 14, No. 10, Mar., 1972.

* cited by examiner

*Primary Examiner*—Albert Decady
*Assistant Examiner*—Guy Lamarre
(74) *Attorney, Agent, or Firm*—Whitham, Curtis & Christofferson, P.C.; Robert A. Walsh

(57) ABSTRACT

Test data is provided through shift registers, operated at a high clock rate comparable to or exceeding a normal high speed clock rate of a chip being tested, to each of a plurality of scan chains configured from registers present on the chip; respective latches of which are connected to inputs and outputs of logic array partitions to be tested. Reduced test clock rate of input and output circuits of the scan chains is accommodated by high speed source and sink shift registers. The source and sink registers are fully loaded and unloaded between consecutive test clock signals and test signals are preferably applied to and collected from the chip in a single serial string through a single pair of tester input/output pins. Testing time is thus reduced without requiring design time and chip space for a clock tree optimized for high speed operation while use of testers of reduced cost and having an arbitrarily small number of input/output pin pairs and independent of test register configuaration on the chip can be used.

12 Claims, 3 Drawing Sheets

HIGH SPEED SINK/SOURCE REGISTER TO REDUCE LEVEL SENSITIVE SCAN DESIGN TEST TIME

BACKGROUND OF THE INVENTION

1. Field of the Invention

The present invention generally relates to testing of semiconductor integrated circuits during manufacture and, more particularly, to the testing of combinatorial logic arrays using level sensitive scan testing techniques.

2. Description of the Prior Art

Increased integration density has greatly increased the functionality, performance and economy of manufacture of integrated circuit devices due to the increased number of active elements which may be placed in greater proximity on chips simultaneously formed on a wafer. However, freedom from manufacturing defects must be ascertained by propagating a sufficient number of different combinations of logic level signals therethrough to be able to determine that the device will perform correctly for any digital signals applied thereto.

For relatively simple circuits that involve relatively few inputs and relatively few dependencies on prior execution cycles, a relatively small and simple test program may be constructed to ascertain freedom from manufacturing defects. However, with the increased functionality of integrated circuit device and the corresponding increase in number of inputs and dependencies on numerous prior execution cycles, it is unacceptably time-consuming and complex to create test programs to pre-condition inputs to the correct state for testing even only one combination of inputs. The corresponding test time is also prohibitive.

To reduce testing time and simplify the test generation process, a design referred to as level sensitive scan design (LSSD) is employed. The current practice of implementing LSSD is to provide a separate test input port to all registers in the device and to connect the output of each register to the test port of another register to form scan chains throughout a sufficient portion of the device to provide inputs to and collect outputs from logic arrays to be tested. Several parallel scan chains can be formed in this manner if desired. In this way, signals to be applied to the logic array can be loaded into the registers by scanning and the registers used to provide signals in parallel to the logic array(s) via the test path. The output of the logic arrays could be collected in a similar register using a mode switch or other expedient for each register stage. Using this technique, additional gains in testing time reduction were sought by providing direct control of logic inputs via the register(s), partitioning the logic arrays into blocks and testing a plurality of partitions concurrently in parallel.

However, to reduce the LSSD test structure, design costs and possibly chip area occupied by the test path and associated controlling logic (which are not used during normal operation of the chip), input and ouput circuits of portions of the test path are not generally optimized to operate at the high normal speed cycle time of the chip. Therefore, substantial time was required for loading and unloading the test register. In theory, this loading and unloading time could be reduced by configuring the register in a plurality of segments to obtain a number of stages equal to the number of inputs to logic array partitions to be simultaneously tested. However, the number of input and output pins provided on test apparatus is limited and cost of test apparatus increases dramatically with the number of input and output pins provided since the tester apparatus must be substantially replicated for each input/output pair of pins. The number of parallel sections of the test register that can be provided is thus limited, as a practical matter, to the number of input or output pins provided in the tester apparatus.

Therefore there is a trade-off between the number of parallel sections of the test register on the chip (which can be loaded and unloaded at a lower rate or longer cycle time) and the cost of the test apparatus. Since the cost of tester overhead during a test is the primary reason for seeking to reduce level sensitive scan test time, there is little gain to be obtained by reduction of loading and unloading time by using plural parallel test register sections which can only be accommodated by a more expensive tester apparatus. Similarly, reduction of the length of test register sections to reduce loading and unloading time of the test register sections by limiting the number of logic array partitions (and/or the size thereof) provides little if any reduction in cost of tester overhead when the number of tests must be correspondingly multiplied to test a given number of logic array gates.

In other words, if the loading and unloading time is halved by using two parallel test register sections but the provision of a second pair of input and output pins to accommodate the two test register section doubles the cost of the tester apparatus, there would be no reduction in the cost of tester overhead. Similarly, if the loading and unloading time is halved by reducing the number of signals to be provided to a reduced number or size of logic array partitions simultaneously tested but the number of tests per chip were correspondingly doubled, there would be no reduction (and probably an increase) in the cost of tester apparatus overhead. Accordingly, reduction of the length of test register sections for a given number of signals to be applied to and collected from logic array partitions is limited by the capacity of the tester apparatus (and, in turn, limits the number of logic array partitions which can be simultaneously tested) and the loading and unloading time of the test register dominates the cost of level sensitive scan testing.

It should also be recognized from the foregoing that the configuration of the test register establishes a minimum number of input/output pin pairs required for a tester apparatus adequate to perform level sensitive scan testing of chips including a test register of a given design. While it is possible to reconfigure a test register, provision of such a facility would require additional expenditure of design time in regard to the test register which is non-functional during normal operations. By the same token, optimization of the test register input/output circuits to increase signal propagation speed therethrough increases chip cost without producing any functional benefit during normal operation of the chip. In general, given the capacity of test registers required to significantly reduce testing time, the cost of increasing signal propagation speed thereof (including additional design time and resources to optimize the LSSD test structure for speed and the possible increase of chip area to do so) cannot be fully compensated by reduction of cost of tester apparatus overhead. Therefore, at the present state of the art, no technique or apparatus is available that can significantly reduce the time and/or cost of level sensitive scan testing of integrated circuit chips.

SUMMARY OF THE INVENTION

It is therefore an object of the present invention to provide a test register which can be rapidly loaded and unloaded at high speed comparable to or even substantially exceeding normal high clock cycle speed of the integrated circuit and is of arbitrary size and configuration, independent of tester apparatus input/output pin capacity.

It is another object of the invention to provide a technique and apparatus for reducing time and tester apparatus overhead for level sensitive scan design testing of integrated circuits.

It is a further object of the invention to provide a technique and apparatus for performing level sensitive scan design testing with apparatus providing an arbitrarily small number of input/output pin pairs.

It is yet another object of the invention to provide for reduction of LSSD testing time without optimization or redesign for shift rate increase of test registers or scan chains.

In order to accomplish these and other objects of the invention, an integrated circuit is provided having a logic array and configurable registers forming scan chains with respective stages connected to inputs and outputs of the logic array, comprising a source shift register including a number of stages equal to a number of scan chains and having each stage connected to an input of a respective scan chain, a sink shift register including a number of stages equal to a number of scan chains and having each stage connected to an output of a respective scan chain, and scan chain input and output circuits clocked at a test clock rate less than a normal high speed clock rate of the chip.

In accordance with another aspect of the invention, a method of performing level sensitive scan design testing of an integrated circuit chip comprising steps of configuring registers on the chip into scan chains having respective register stages connected to respective inputs and outputs of a legic array to be tested, shifting data through the scan chains at a test clock rate lower than a normal clock rate of the chip, providing test data to the scan chains through a source shift register clocked at a high speed clock rate, and collecting outputs from the scan chains through a sink shift register clocked at a high speed clock rate; the high speed clock rate being higher than the clock rate applied to the scan chains and comparable to or exceeding the normal high speed clock rate of the chip.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
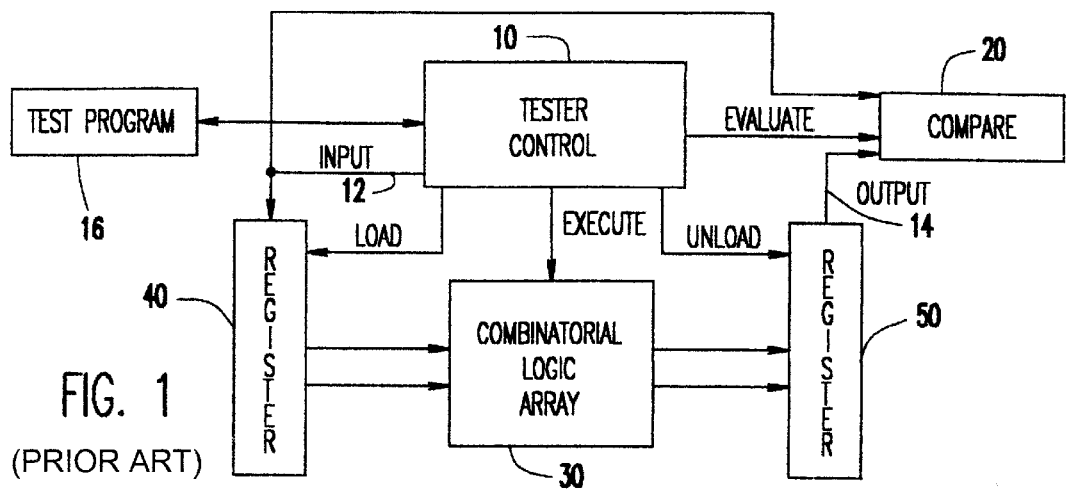
FIG. 1 is a block diagram of a first conventional technique of performing level sensitive scan testing.
Figure 2:
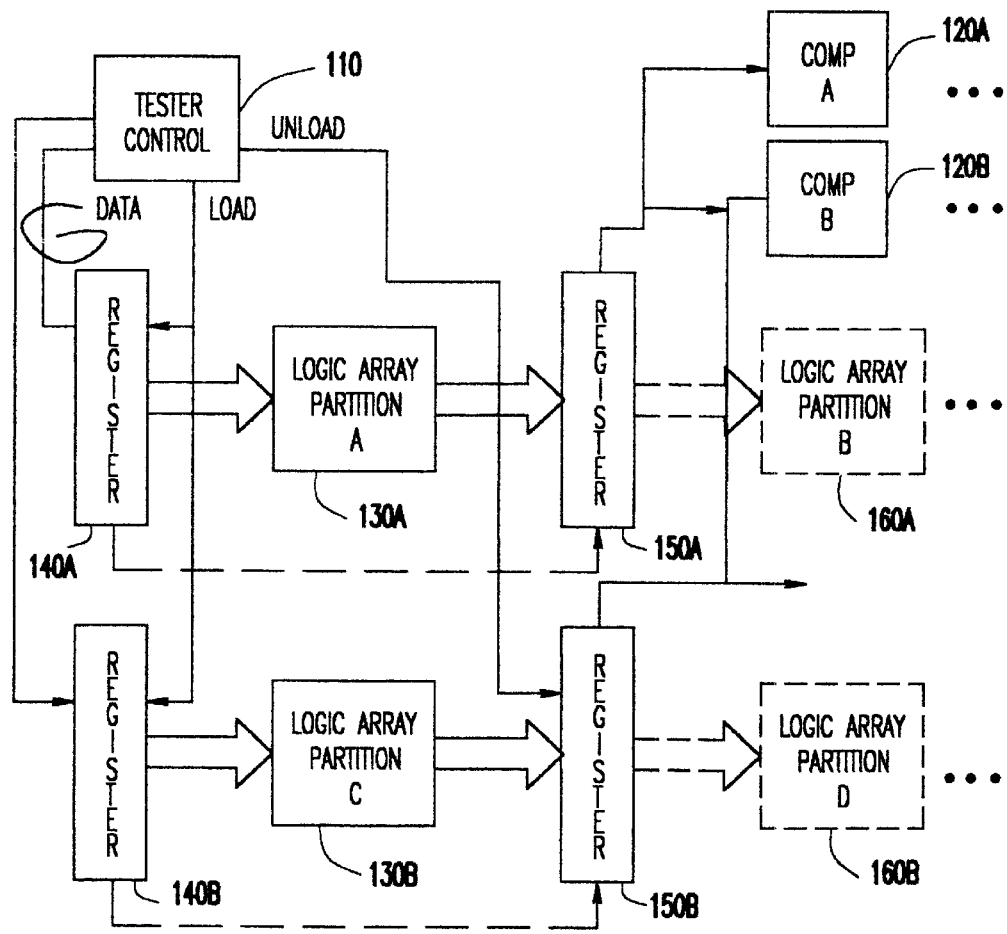
FIG. 2 is a block diagram of a second conventional technique of performing level sensitive scan testing.
Figure 3:
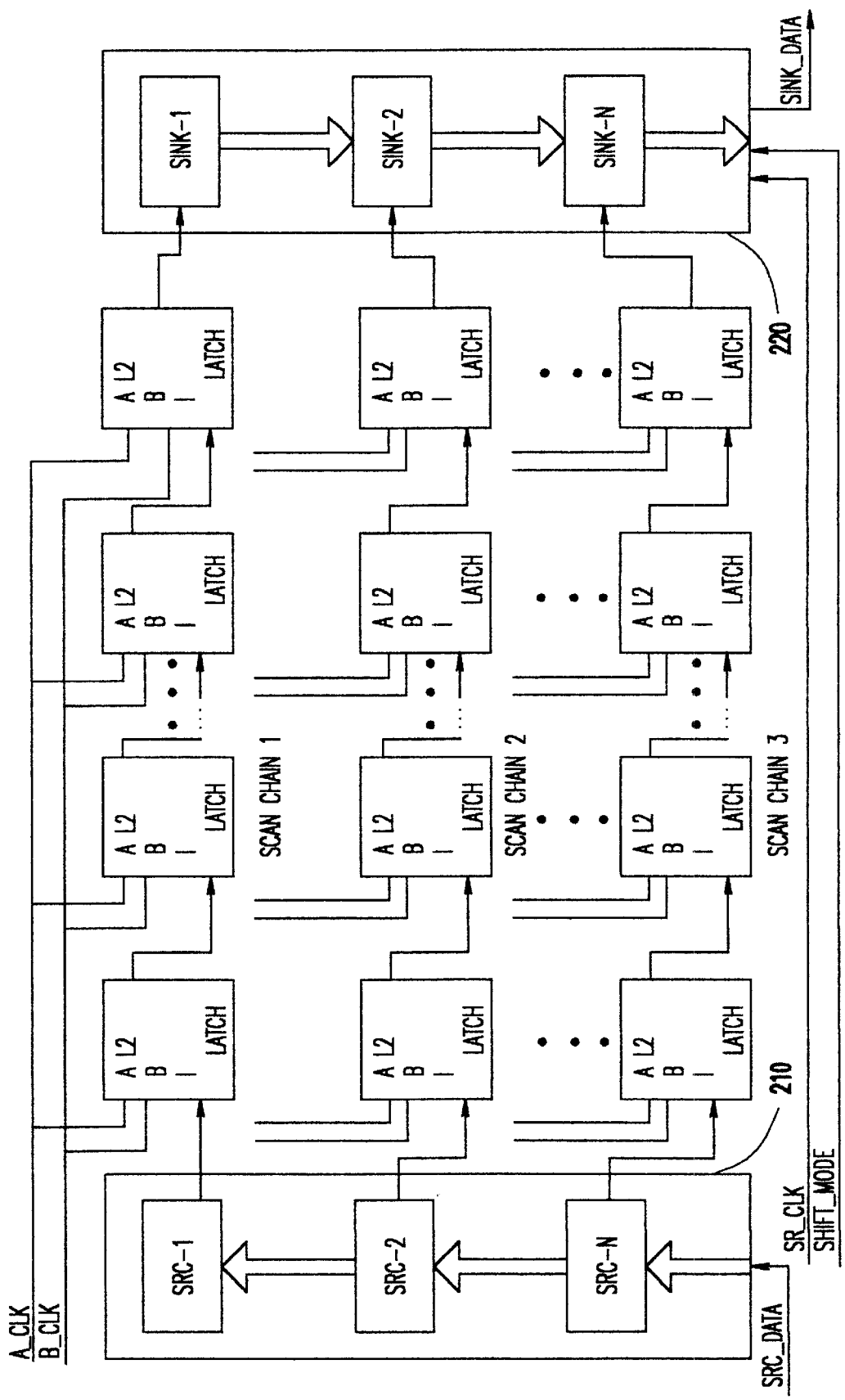
FIG. 3 is a block diagram of a technique of performing level sensitive scan testing in accordance with the present invention.

Referring now to the drawings, and more particularly to FIGS. 1 and 2, there are shown schematic block diagrams representing first and second conventional technique of level sensitive Scan Design (LSSD) testing. It should be recognized that the depictions of FIGS. 1 and 2 are arranged to contrast the present invention, as depicted in FIG. 3, therewith in order to more fully convey an understanding of the invention. Therefore, no portion of any Figure is admitted to be prior art as to the present invention.

In the arrangement of FIG. 1, tester control 10 and comparator 20 are considered to be respective elements of any tester apparatus suitable to perform LSSD testing. Connections 12 and 14 represent a single pair of pins including an input pin and an output pin for connection to the chip and providing and retrieving LSSD data patterns in accordance with a test program 16. Comparator 20 provides the function of identifying the portion of the test data sequence which has been employed and determining if the output data matches the expected output. The expected output, of course, is determined by the intended function of combinatorial logic array 30 and the input signals thereto. The development of suitable sequences of input data is well-understood in the art and not important to the successful practice of the invention.

In operation, this particular technique of LSSD testing causes a sequence of data patterns to be individually transferred from program source 16 to the tester control 10 (generally in serial form) and thence (or directly) to a test register 40 from which it is applied in parallel to combinatorial logic array 30. The output of logic array 30 is then collected by another test register 50 and checked against an expected output at comparator 20. The tester control 10 may provide enabling signals to test register 40, 50 and combinatorial logic array 30, if needed.

As alluded to above, this technique is relatively slow since test registers 40, 50 are preferably loaded with serial data to limit the number of conductors and support circuits which must be formed on the chip and, as alluded to above, inputs and outputs of test registers 40, 50 are not optimized to operate at clock rates and cycle times of the chip. Further, the tester controller 10 must control the readout of each data pattern from program 16 and the transfer of the data to the register 40 as well as the collection of the combinatorial logic output in register 50 and transfer, again usually in serial form, to comparator 20. Therefore, this technique is not economically viable for testing larger and more complex combinatorial logic arrays which must be tested with comparatively long sequences of signal combinations, each having comparatively large numbers of bits which require similarly longer times to shift into and out of test registers 40, 50.

Referring now to FIG. 2, an arrangement for performing LSSD testing somewhat more rapidly than the arrangement of FIG. 1 will now be discussed. This arrangement of FIG. 2 is somewhat more chip hardware efficient than the arrangement of FIG. 1 since the same registers 140a, 140b, 150a, 150b, etc. are used to both input signal patterns and collect logic array output. It should be noted that the logic array 130 is depicted as being partitioned into two exemplary partitions 130a, 130b which receive data from and return logic array output to substantially arbitrary but preferably sequential groups of register stages. Respective portions of the registers (e.g. 140a, 150a, etc.) are preferably connected serially and more register sections may be included to collect data from additional logic array partitions (e.g. 160a, 160b) as well as to supply input signals to them in the manner illustrated for register sections 150a, 150b. Tester control 110 directly supplies the test signal patterns in sequence, thus avoiding separate cycles to obtain them from a stored program.

In operation, a test signal pattern is shifted into each of the registers 140a, 140b and applied to respective partitions of the combinatorial logic array 130. A mode signal is provided to test logic on the chip to cause the registers (e.g. 150) to capture outputs of the logic partitions. Then, shift mode is resumed and signals are shifted out to comparators 120a, 120b to determine if errors have occurred. If additional logic array partitions are accommodated, the outputs could be shifted out to additional comparators (requiring additional tester inputs) or shifted out serially with the signals from registers 150a, 150b (in which case the shift sequence is extended and additional time is required). Thus FIG. 2 aptly illustrates the trade-off between tester complexity and cost and the time required for LSSD testing as alluded to above.

That is, the tester of FIG. 2 is depicted as providing two pairs of input and output pins (in contrast with the single pair depicted in the arrangement of FIG. 1. Thus, a corresponding two registers 140a, 140b can be provided and test time reduced by loading and unloading these registers in parallel but at the expense of providing two sources of signals and two comparators 120a, 120b in the tester. Therefore, as alluded to above, the arrangement of FIG. 2 provides some gain in on-chip hardware efficiency and some improvement in reduction of LSSD testing time but at the expense of requiring a more expensive tester having a plurality of pairs of input/output pins and multiplied internal components.

Thus little gain is achieved in terms of tester overhead and the testing process remains dominated by the input circuit clock rate to test registers 140a, 140b. Moreover, by utilizing plural, parallel test registers, the chip may only be tested by a tester having a corresponding plurality (or greater number) of pairs of input/output pins. Accordingly, registers 140a, 140b, 150a, 150b, ... must be relatively long to provide the number of bits of input and output necessary to accommodate the number of inputs or outputs of the number of combinatorial logic array partitions to be concurrently tested. Smaller partitions will increase the number of tester input/output pin pairs needed, thus increasing tester cost but decreasing test time.

It should be appreciated that the efficiency of the arrangement of FIG. 2 is limited, for any given number of input/output bits, by the number of registers which can be provided in parallel. The number of registers (e.g. 140a, 140b) is, in turn limited by the number of input/output pin pairs which can be provided by the tester at significant expense and the elimination of the possibility of using a tester having a smaller number of input/output pin pairs. Since the number of parallel test registers is limited, there has been no alternative, prior to the present invention, to reduce the length and loading/unloading time of the test registers while maintaining the given number of input/output bits other than the limitation of testing to more expensive testers having increased numbers of input/output pins. Likewise, there has been no alternative which avoids the correspondence of the test register configuration to a given capacity of the tester. Speed of loading and unloading of the test registers can otherwise only be increased by optimization of the port to register circuitry and clocking thereof which do not contribute to chip function or performance during normal operation.

More specifically, LSSD testing requires that all test input signals be present in the correct latches throughout the chip within the same clock cycle. Meeting this requirement implies the use of a so-called "clock tree" to deliver clock signals throughout the chip simultaneously or effectively so. Since even high speed normal operation can accommodate some variation from exact synchronism between different, separated, regions of the chip, LSSD testing and shifting of test signals would require clock tree complexity and optimization (as well as chip area) substantially beyond that which is necessary to support normal high speed operations of the chip. Additionally, the test registers are configured by enablement of test inputs or some other switching arrangement, generally in response to a test clock signal. Therefore, expensive (and inefficient, in terms of chip space and normal chip function) can only be avoided by reducing the test clock rate far below the normal high speed clock rate of the chip. This latter expedient is generally adopted, notwithstanding the limitations on testing time which it imposes.

However, the present invention allows reduction in test register (hereinafter sometimes referred to as "scan chain") length as well as avoiding the requirement of correspondence in the number of parallel test registers/scan chains through provision of additional, relatively short but high speed registers at the input and output of the scan chains as shown in FIG. 3. These registers also allow high speed loading and unloading at rates that may exceed the normal high speed clock rates of the chip since these source and sink registers may be provided in small areas. In FIG. 3, it should be noted that the tester is again depicted as having only a single pair of input/output pins in order to facilitate conveyance of an appreciation of the meritorious effects of the invention (although testers with greater numbers of pin pairs could be used). In the arrangement of FIG. 3, the connections to the (possibly and preferably partitioned) combinatorial logic and the operation thereof are essentially the same as are depicted in FIG. 2 and are omitted from FIG. 3 in the interest of clarity.

The invention, as depicted in FIG. 3, adds two relatively short, high speed shift registers 210, 220 at the inputs and outputs of a substantially arbitrary number of scan chains. (The relative length and number of the scan chains would be approximately optimized when the ratio of number of the scan chains approximates the ratio of shift rates of the high speed shift registers 210, 220 (independent of, but possibly equal to, the normal high speed clock rate of the chip but which may substantially exceed the normal high speed clock rate of the chip) to the shift rate of the scan chains.) All that is necessary for LSSD testing is for the total number of stages in all scan chains to accommodate the number of inputs or outputs of the number and respective sizes of combinatorial logic array partitions to be concurrently tested. Thus, since the source and sink registers can be loaded and unloaded at high speed, all scan chains can be loaded and unloaded within the time required to load and unload the longest scan chain rather than the total number of latches in all scan chains.

Shift registers 210, 220 function substantially as a demultiplexer at the inputs of the scan chains and a multiplexer at the outputs of the scan chains, respectively. The shift registers 210, 220 are preferably optimized to operate at a shift rate such that data may be shifted through the entire length thereof in a time period corresponding to (e.g. slightly less than) the time to shift from one latch to the next in the scan chains in order to maximize signal input rate to the scan chains.

That is, the shift rate of shift registers 210, 220 is chosen such that a number of signals equal to the number of scan chains can be delivered to the inputs of all scan chains by shift register 210 at the maximum shift rate of the scan chains and between scan chain shifting operations. By the same token, collected outputs of the combinatorial logic array (partitions) can be shifted out of shift register 220 at the maximum rate the collected signals can be delivered thereto.

It should be appreciated that the invention can thus provide both input and output efficiencies over respective single tester connections and thus LSSD testing can be accomplished with the least expensive of suitable testers having only a single pair of input/output pins or a plurality of pairs of input/output pins. It should also be appreciated that combinatorial logic arrays may be distributed over numerous sections of a chip and plural arrays of scan chains in accordance with the invention can be provided on the chip; allowing a corresponding plurality of combinatorial logic arrays to be simultaneously tested using tester apparatus having plural pairs of input/output pins.

It will also be appreciated that an array of scan chains and a pair of high speed shift registers at the inputs and outputs thereof may be embodied and operated in numerous ways which will be apparent to those skilled in the art in light of the foregoing discussion. It is preferred by the inventor at the present time to use so-called L1/L2 latches (or other type of latches operating in a master/slave fashion) which utilize clock signals of different phases to accept input data and transfer data to an output, respectively, in the scan chains. The type of latches in the high speed source (210) and sink (220) registers is not important to the successful practice of the invention. However, duplication of optimized latch designs utilized in the remainder of the chip is often convenient and generally avoids a substantial portion of the cost of design of the shift registers.

Figure 4:
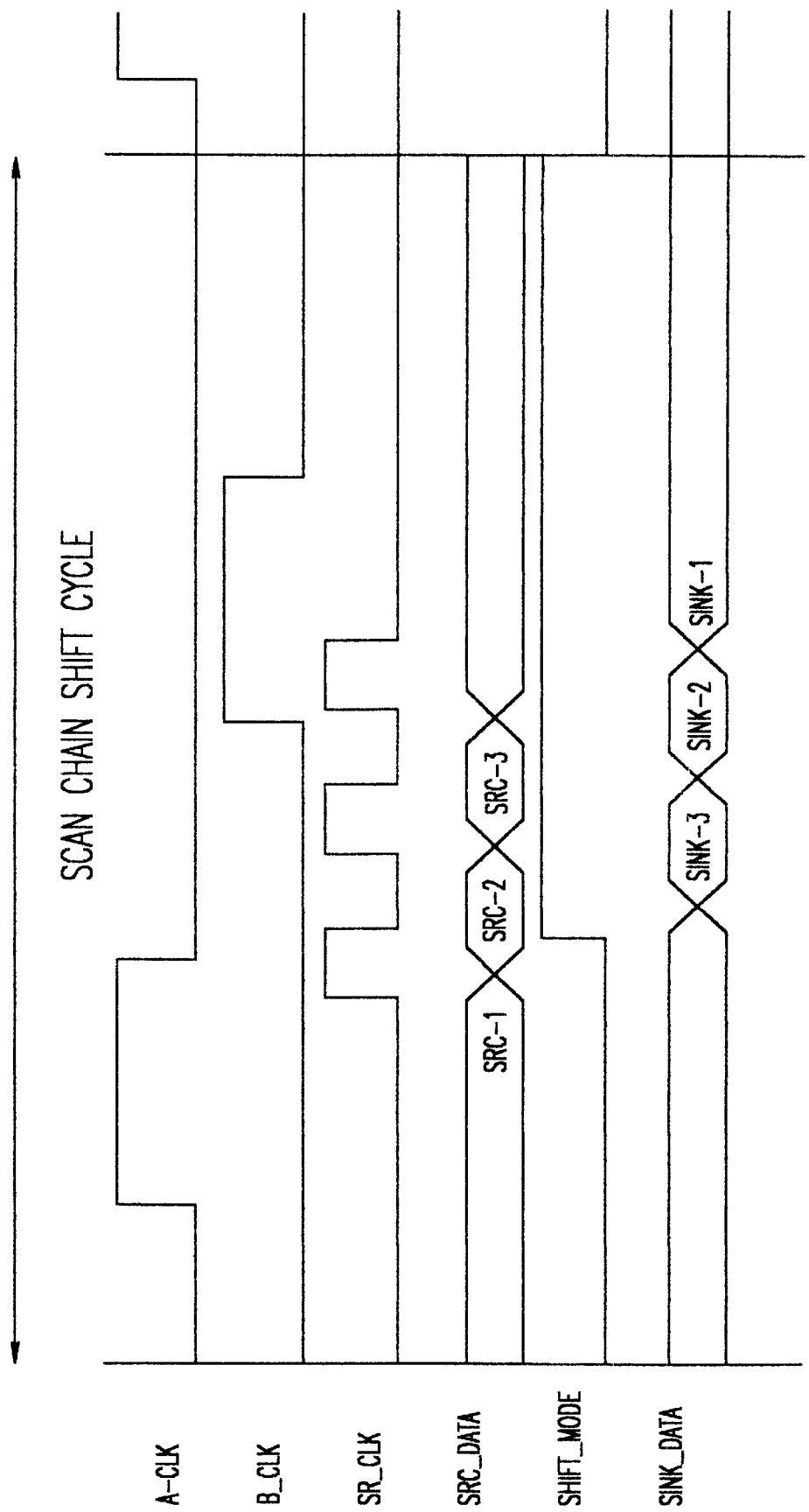
FIG. 4 is a timing diagram depicting operation of the apparatus of FIG. 3 and the method of its operation.

A preferred, exemplary, mode of operation of the preferred embodiment will now be described with reference to FIG. 4. While the depiction of FIG. 3 is generalized as to the number of scan chains provided, it will be sufficient and hence assumed for purposes of the following discussion that N=3. Thus, for purposes of this discussion, the source and sink shift registers will be considered to be three stages long and there are three scan chains of arbitrary length.

It should be understood that L1/L2 (or master/slave) latches each contain two interconnected and separately clocked serial latches; the output of the first being connected to the input of the second. In this case, it is assumed that the input of the first (L1) latch is clocked by the rising A_CLK signal and the data is transferred between the first and second latches and appears at the output of the second latch in response to assertion of the rising edge of the B_CLK signal. One scan chain shift cycle, as indicated in FIG. 4, is required to shift the contents of L1/L2 latch stage to the next L1/L2 latch.

The (three-bit) source shift register 210 is loaded with data on the falling edge of SR_CLK such that contents of SRC-1 are loaded with contents of SRC-2, contents of SRC-2 are loaded with contents of SRC-N and contents of SRC-N are loaded with SRC_DATA. It should be noted from FIG. 4 that the source shift register loading occurs between consecutive A_CLK signals so that the data will be safely and reliably loaded into the first stages of respective scan chain registers on the following A_CLK.

The (three-bit) sink shift register 220 captures the outputs of the respective scan chains into SINK-1, SINK-2 and SINK-N latches on the falling edge of SR_CLK when shift mode =0. At this point, the SINK-N data is on the SINK_DATA output. When SHIFT_MODE is set =1, subsequent SR_CLK pulses shift the captured data onto the SINK_DATA output in sequential order. Thus the number of scan chain cycles required to propagate data through all latches to a single tester input equals the number of latches in the longest of the scan chains whereas, without the invention, the number of scan cycles would equal the total number of latches in all scan chains and could only be reduced at the expense of additional tester inputs.

In view of the foregoing, it is seen that the invention provides a viable alternative to optimization of input and clock circuits for testing, particularly as it requires little if any additional chip space; the scan chains being configured from registers already present on the chip, the source and sink registers being optimized for a high speed clock cycle time comparable to or exceeding the clock cycle time of which the remainder of the chip is capable. Further, the invention provides for a reduced number of scan chain cycles relative to a given number of tester inputs and allows flexibility of tester use since the number of tester input/output pin pairs is not governed by chip design. By the same token, the invention allows use of testers of reduced expense which need have a minimal number of input/output pin pairs while reducing test time and avoiding trade-offs between testing time and tester cost.

While the invention has been described in terms of a single preferred embodiment, those skilled in the art will recognize that the invention can be practiced with modification within the spirit and scope of the appended claims. For example, the principles of the invention can be applied multiple times on a chip, for example, in different regions thereof and providing plural groups of scan chains with each group of scan chains corresponding to a partition or group of partitions of a logic array and connected to respective tester input/output pin pairs. As another example of the application of the principles of the invention, the serial input and output data could be provided through multiplexers and demultiplexers or other switching arrangements to and from the chip through plural pairs of input/output pins on a tester, if available.

Having thus described my invention, what I claim as new and desire to secure by Letters Patent is as follows:

1. An integrated circuit operable at a first high speed clock rate having a logic array and means for configuring registers into scan chains with respective stages connected to inputs and outputs of said logic array for testing of said logic array, said integrated circuit comprising a source shift register including a number of stages equal to a number of scan chains and having each stage connected to an input of a respective scan chain, said source shift register being clocked at a second high speed clock rate, a sink shift register including the number of stages equal to the number of scan chains and having each stage connected to an output of a respective scan chain, said sink shift register being clocked at a second high speed clock rate, and scan chain input and output circuits clocked at a test clock rate less than said second high speed clock rate.

2. An integrated circuit as recited in claim 1, wherein the number of scan chains approximates a ratio of said test clock rate to said second high speed clock rate.

3. An integrated circuit as recited in claim 1, wherein said logic array is partitioned into at least two partitions.

4. An integrated circuit as recited in claim 1, wherein said second high speed clock rate is equal to said first high speed clock rate of said chip.

5. A method of performing level sensitive scan design testing of an integrated circuit chip, said method comprising steps of configuring registers on said chip into scan chains having respective register stages connected to respective inputs and outputs of a logic array to be tested, shifting data through said scan chains at a test clock rate lower than a first high speed clock rate of said chip, providing test data to said scan chains through a source shift register clocked at a second high speed clock rate exceeding said test clock rate, and collecting outputs from said scan chains through a sink shift register clocked at said second high speed clock rate.

6. A method as recited in claim 5, including the further step of providing test data to said chip through a single tester output pin.

7. A method as recited in claim 5, including the further step of providing logic array output serially to a tester over a single tester input pin.

8. A method as recited in claim 5, wherein said second high speed clock rate equals said first high speed clock rate of said chip.

9. A method as recited in claim 5, wherein the number of scan chains approximates a ratio of said test clock rate to said second high speed clock rate.

10. A method as recited in claim 5, wherein said logic array is partitioned into at least two partitions.

11. A method as recited in claim 5, wherein said scan chains include input and output circuits clocked at said test clock rate.

12. A method as recited in claim 5, wherein said collecting and providing steps a re provided between consecutive test clock signals.

\* \* \* \* \*